United States Patent [19]

Itozaki et al.

[11] Patent Number: 5,100,866
[45] Date of Patent: Mar. 31, 1992

[54] PROCESS FOR PRODUCING COMPOUND OXIDE HIGH TEMPERATURE SUPERCONDUCTING MATERIAL $TL_yCU_{1-y}O_{3-z}$ WHERE RE=Y OR LA

[75] Inventors: Hideo Itozaki; Saburo Tanaka; Nobuhiko Fujita; Shuji Yazu; Tetsuji Jodai, all of Hyogo, Japan

[73] Assignee: Sumitomo Electric Industries Ltd., Osaka, Japan

[21] Appl. No.: 426,667

[22] Filed: Oct. 26, 1989

Related U.S. Application Data

[62] Division of Ser. No. 223,634, Jul. 25, 1988.

[30] Foreign Application Priority Data

Jul. 25, 1987 [JP] Japan .................................. 62-185739
Jul. 26, 1987 [JP] Japan .................................. 62-185710

[51] Int. Cl.$^5$ ...................... C01F 11/02; C01F 17/00; C01G 3/02; C01G 15/00
[52] U.S. Cl. ........................................ 505/1; 252/521; 423/604; 423/624; 423/635; 501/123; 501/152; 505/779; 505/783
[58] Field of Search ................. 505/783, 1, 779; 423/604, 624, 635; 252/561; 501/123, 152

[56] References Cited

U.S. PATENT DOCUMENTS

4,870,052  9/1989  Engler et al. .......................... 505/1
4,962,083  10/1990  Hermann ................................ 505/1

OTHER PUBLICATIONS

Murphy "New Superconducting Cuprate Perovskites", Phys. Rev. Lett. vol. 58 (18), May 4, 1987, pp. 1888–1890.
Gruen "Formation of Perovskite Surface Layers by Oxidation of Cu–La–Sr . . . ", J. Electrochemical Soc., Jun. 1987, pp. 1588–1589.
Nakamura "Oxygen Deficiency and Superconducting Properties of Yttrium Oxide Compounds", MRS Conference: Superconductivity Apr. 1987, pp. 8239–8242.
Cava "Bulk Superconductivity at 91K in Single-Phase . . . Ba$_2$YCu$_3$O$_{9-8}$", Phys. Rev. Lett., vol. 58 (16), Apr. 20, 1987, pp. 1676–1679.
Hasegawa "High Tc Superconductivity of (La$_{1-x}$Sr$_x$)$_2$Cu O$_4$-Effect of . . . ", Jap. Jnl. Appl. Phys. vol. 26(4) Apr. 1987, pp. L337–L338.
Sheng et al., "Superconductivity at 90K in the Tl–Ba–Cu–O System", Phys. Rev. Lett., vol. 60, No. 10, 1988, pp. 937–940.
Hazen et al., "100-K Superconducting Phases in the Tl–Ca–Ba–Cu–O System", Phys. Rev. Lett., vol. 60, No. 16, Apr. 18, 1988, pp. 1657–1660.
Sheng et al., "New 120 K Tl–Ca–Ba–Cu–O Superconductor", Appl. Phys. Lett., May 16, 1988, pp. 1738–1740.
Sheng, Z. Z. et al., "Superconductivity in the Rare-Earth-Free Tl–Ba–Cu–O System Above Liquid Nitrogen Temperature"; Nature, Mar. 3, 1988, pp. 55–58.
Sheng et al., "Bulk Superconductivity at 120K in the Tl–Ca/Ba–Cu–O System", Nature, Mar. 10, 1988, pp. 138–139.
Gao et al., "Bulk Superconductivity in Tl$_2$CaBa$_2$Cu$_2$O Up to 120K", Nature, Apr. 14, 1988, pp. 623–624.

Primary Examiner—Paul Liberman
Assistant Examiner—John Boyd
Attorney, Agent, or Firm—Kerkam, Stowell, Kondracki & Clarke

[57] ABSTRACT

A superconducting material and a process for producing a superconducting material comprising a compound oxide represented by the general formula:

$$(Ba, \gamma)_x(\alpha, \beta)_{1-x}\epsilon_y Cu_{1-y}O_{3-z}$$

in which
"$\gamma$" represents an element of the IIa group of the periodic table except Ba, and atomic ratio of $\gamma$ to Ba, being selected in a range between 1% and 90%,
"$\alpha$" represents Y or La,
"$\beta$" represents an element of the IIIa group of the periodic table but is different from $\alpha$, an atomic ratio of $\beta$ to $\alpha$ being selected in a range between 1 and 90%,
"$\epsilon$" represents a metal element of the IIIb group of the periodic table, x, y and z are numbers each satisfies ranges of $0 \leq x \leq 1$, $0 \leq y \leq 1$, and $0 \leq z \leq 1$ respectively, and
the expression of (Ba, $\gamma$) and ($\alpha, \beta$) mean that the respective elements occupy predetermined sites in a crystal in a predetermined proportion.

16 Claims, No Drawings

PROCESS FOR PRODUCING COMPOUND OXIDE HIGH TEMPERATURE SUPERCONDUCTING MATERIAL TL$_y$CU$_{l-y}$O$_{3-z}$ WHERE RE=Y OR LA

CROSS REFERENCE TO RELATED APPLICATIONS

This application is a divisional application of U.S. patent application Ser. No. 223,634, filed July 25, 1988.

BACKGROUND OF THE INVENTION

1. Field of the Invention

The present invention relates to a superconducting material and a method for preparing the same. More particularly, it relates to a novel superconducting material composed of compound oxide having a high critical temperature and a method for preparing the same.

2. Description of the Related Art

The phenomenon of superconductivity is understood in the art as a condition wherein perfect diamagnetism is observed and no difference in potential is observed and wherein an electric current of a constant finite value is observed internally in the superconducting medium.

Superconductivity and superconducting materials can be utilized in the field of electrical power applications such as MHD power generation, fusion power generation, power transmissions, electrical power reservation or the like; in the field of transportation, for example, magnetic levitation trains, magnetically propelled ships or the like; in the medical field, for example, in a high-energy beam radiation unit; in the field of science, such as in NMR or high-energy physics; for highly sensitive sensors or detectors for sensing very weak magnetic fields, microwave, radiant rays or the like, or in the field of fusion power generation. In addition to the above mentioned electrical power applications, superconducting materials can be used in the field of electronics, for example, as a device using the Josphson device which is expected to be a high-speed and low-power-consuming switching device.

The phenomenon of superconductivity, however, has heretofore been observed only at very low cryogenic temperatures. In fact, a relatively low temperature of 23.2° K, which was the critical temperature (Tc) of a superconductor composed of Nb$_3$Ge has until recently been the highest record critical temperature among known superconducting materials.

At such temperature, liquidized helium (boiling point of 4.2° K.) is the only cryogen which can be employed to realize this very low critical temperature in the superconducting material. However, helium is not only a limited, costly resource, but also requires a large-scale system for liquefaction. Therefore, there had been a strong demand for other superconducting materials having higher critical temperatures (Tc), however no materials having critical temperatures exceeding the above mentioned Tc had been discovered in approximately the past ten years.

Reports of the existence of a new type of superconducting material having a much higher Tc were published by Bednorz and Muller, who discovered a new oxide type superconductor in 1986 [Z. Phys. B64 (1986) 189]. It has also been reported in February 1987 that C.W. Chu et al discovered, in the United States of America, another high-temperature superconducting material, termed a YBCO type, of the form YBa$_2$Cu$_3$O$_{7-x}$, having a critical temperature of about 90° K.

Hence, much activity in the field of high-temperature superconductors has taken place in the ensuing months.

It had been known that certain compound oxide ceramic materials exhibited the property of superconductivity. For example, U.S. Pat. No. 3,932,315 discloses a Ba-Pb-Bi type compound oxide which exhibits superconductive properties and Japanese patent laid-open No. 60-173,885 discloses that Ba-Bi type compound oxides also exhibit superconductive properties. These superconducting materials, however, possess rather low transition temperatures of about 10° K. and hence usage of liquidized helium (boiling point of 4.2° K.) as a cryogen had been indispensable in order to cool the material sufficiently to realize superconductivity. Therefore, the above mentioned new type compound oxides in which superconductivity is realized at temperatures attainable using liquid nitrogen, which is a relatively cheap cryogen, will accelerate actual usage of superconductors.

An object of the present invention is to provide a new system of compound oxides which possess a higher critical temperature and a method for preparing the same.

SUMMARY OF THE INVENTION

A superconducting material according to the present invention is composed of a compound oxide represented by the general formula:

$$(Ba, \gamma)_x(\alpha,\beta)_{1-x}\epsilon_y Cu_{1-y}O_{3-z}$$

in which

"$\gamma$" represents an element of the IIa group of the periodic table except Ba, an atomic ratio of $\gamma$ with respect to Ba is selected in a range between 1% and 90%, "$\alpha$" represents Y or La, "$\beta$" represents an element of the IIIa group of the periodic table but is different from $\alpha$, an atomic ratio of $\beta$ with respect to $\alpha$ is selected in a range between 1% and 90%, "$\epsilon$" represents a metal element of the IIIB group of the periodic table, x, y and z are numbers which satisfy ranges of $0 \leq x \leq 1$, $0 \leq y \leq 1$, and $0 \leq z \leq 1$ respectively, and the expression of (Ba, $\gamma$) and ($\alpha,\beta$) means that each of these elements occupies a predetermined site in a crystal in a predetermined proportion.

A process for producing a superconducting material according to the present invention comprises preparing a material powder, compacting the material powder and then subjecting the resulting compact to a final sintering operation, the process being characterized in that the material powder is selected from a group comprising one of the following groups (A), (B) and (C):

(A) a powder mixture composed of powders selected from a group comprising:
 (i) powders of elements Ba, Cu, $\alpha$, $\beta$, $\gamma$ and $\epsilon$ and
 (ii) powders of compounds each containing at least one of said elements Ba, Cu, $\alpha$, $\beta$, $\gamma$ and $\epsilon$;

(B) a sintered powder obtained by sintering preliminarily the powder mixture (A) and then pulverizing the sintered mass; and (C) a powder mixture of said powder mixture (A) and said sintered powder (B), in which, "$\gamma$" represents an element of the IIa group of the periodic table except Ba, "$\alpha$" represents Y or La, "$\beta$" represents an element of the IIIa group of the periodic but is different from $\alpha$, and "$\epsilon$" represents a metal element of IIIb group of the periodic table, wherein, an atomic ratio of (Ba, γ): (α, β): ε: Cu in said material powder satisfies a ratio of x : (1−x) : y : (1−y), in which an atomic ratio of γ to Ba is selected in a range between 1% and 90%, an atomic ratio of β to α is selected in a range between 1% and 90%, x and y are numbers each satisfying ranges of $0 \leq x \leq 1$ and $0 \leq y \leq 1$ respectively.

The sintered compact obtained by the above mentioned process is composed of a so-called quasiperovskite type compound oxide which is represented by the general formula:

$$(Ba, \gamma)_x(\alpha,\beta)_{1-x}\epsilon_y Cu_{1-y}O_{3-z}$$

in which

"γ" represents an element of the IIa group of the periodic table except Ba, an atomic ratio of γ with respect to Ba being selected in a range between 1% and 90%, "β" represents an element of the IIIa group of the periodic table but is different from α, an atomic ratio of β with respect to α being selected in a range between 1% and 90%, "ε" represents a metal element of the IIIb group of the periodic table, x, y and z are numbers each satisfying ranges of $0 \leq x \leq 1$, $0 \leq y \leq 1$, and $0 \leq z \leq 1$ respectively, and the expression of (Ba, γ) and (α, β) means that each of these elements occupies a predetermined site in a crystal in a predetermined proportion.

The atomic ratio of γ with respect to Ba can be selected in a range between 1% and 90% but a preferred result is obtained in a range between 1% and 50%. Further, there is a tendency that preferable properties as superconductors are obtained when the value of x is selected in a range of $0.3 \leq x \leq 0.4$.

The essence of the present invention resides in that the compound oxide is composed of the above mentioned specified elements and oxygen. A unique point of the present invention, in comparison to the above-mentioned known new type superconductors composed of four elements is that the compound oxide according to the present invention has two pairs of elements, each pair of which belongs to the same group of the periodic table. It is believed that an advantageous result of the present invention is obtained when each of these elements occupies a predetermined site in the crystal in a predetermined proportion.

In order to obtain a sintered compound oxide possessing superior superconducting properties, it is indispensable to control the following factors:

(i) particle size of the material powder, (ii) temperature during the preliminary sintering operation, (iii) particle size of the preliminary sintered and pulverized powder, and (iv) temperature during the final sintering operation.

In fact, if an average particle size of the material powder exceeds 10 μm, a fine particle which is satisfactory in uniformity can not be obtained easily even after such material powder is subjected to the preliminary sintering operation. Therefore, the average particle size of the material powder is preferably less than 10 μm.

In the case where a sintered powder (B) which is prepared by preliminary sintering of the powder mixture (A) is used as the material powder, the preliminary sintering is preferably carried out at a temperature which is higher than 700° C. but is not higher than the lowest melting point of any compound which is contained in the powder mixture (A), for a duration of from 1 to 50 hours and preferably in an atmosphere containing oxygen gas of $10^{-3}$ to $10^2$ Torr. It is also preferable that, after the preliminary sintering is complete, the resulting sintered mass is cooled at a cooling rate which is not slower than 1° C./min but not higher than 1,000° C./min. A particle size of the pulverized powder obtained from the preliminary sintered mass directly influences the particle size of a crystal which is obtained after the final sintering operation, so the preliminary sintered mass is preferably pulverized to powder having an average particle size of less than 5 μm. Such fine particles increase the area of grain boundaries, which is one of the critical factors for realizing the superior superconductor which is particularly improved in the critical temperature of superconductivity. Pulverization or reduction of the preliminary sintered mass to particles less than 1 μm in size is not only not economical or practicable but also increases the possibility of contamination of the material powder. Therefore, the average particle size of the preliminary sintered powder is preferably adjusted to a range between 1 μm and 5 μm.

A series of operations of preliminary sintering, pulverization and compacting is preferably repeated several times to homogenize the material powder.

The sintering temperature is one of the critical factors in the process for producing the superconducting compound oxide, therefore the sintering temperature is controlled and adjusted to a temperature at which the sintering proceeds in a solid reaction without substantial fusing of the material powder and excessive crystal growth does not occur in the resulting sintered compound oxide. In fact, the sintering temperature should not exceed the lowest melting point of any component in the material powder such as the powder mixture, the compound powder or the preliminary sintered powder. Conversely, satisfactory sintering can not be effected if the sintering temperature is too low. Therefore, the sintering must be carried out a temperature which is higher than 700° C. The duration of the sintering operation is generally for 1 hour to 50 hours in actual practice, although a longer sintering time is preferable.

The above-mentioned preliminary sintering operation should also be precisely controlled in the same manner as above for the same reason.

According to a preferred embodiment, the sintered compound oxide is further heat-treated in order to homogenize the crystal structure. This heat-treatment improves the critical temperature and reduces remarkably the discrepancy between the terminal temperature of phase change where perfect zero resistance is observed and the critical temperature.

This heat-treatment is preferably carried out in an oxygen containing atmosphere at a temperature of 500° to 900° C. Under this condition of heat-treatment, the crystal structure of the sintered compound oxide is stabilized and the oxygen deficient perovskite structure which is desired for realizing the superconductivity is obtained, the result being that the lower critical temperature where perfect zero resistance is observed becomes much higher and a lasting and stable superconductor is assured. If the temperature of heat-treatment is not higher than 500° C., the above-mentioned effect is not obtained or it takes a longer time before the objective crystal structure is realized. Conversely, if the temperature of heat-treatment exceeds 900° C., the above-mentioned perovskite type crystal structure is lost.

The superconducting material according to the present invention can be used in the form of a sintered mass or article as is and may also be used in a form of a powder which is prepared by pulverizing the sintered mass. This powder-formed superconducting compound oxide can be used for producing a superconducting wire or the like. For example, the superconducting compound oxide powder according to the present invention may be compacted in a metallic pipe which is then drawn into a fine wire or may be mixed with suitable binder such as polyvinylbutylal (PVB) to prepare a paste which can be molded into a desired configuration or which is coated or applied in a desired pattern. The resulting wire or the molded or coated paste are then sintered a final time.

When the superconducting compound oxide according to the present invention is used in the form of a paste, it is preferable to heat the coated or molded paste at 400° to 700° C. in air before the final sintering operation in order to remove the binder.

When a self-supporting article is molded with the paste, it is preferable to select a thickness of the paste to be molded to be less than 1.2 mm, and when a thick film is coated on a support, the thickness of the layer of paste is adjusted to be less than 0.6 mm, because a pre-form molded with the paste by a doctor blade coating technique or extrusion technique will shrink during the final sintering stage so that the dimensions of the final product become smaller. Therefore, when the paste is shaped into a form of a thick film or a self-supporting tape or wire, the thickness or diameter of paste coated or molded is preferably controlled to less than 0.6 mm and 1.2 mm.

The superconducting material according to the present invention can be formed into a thin film by a conventional physical vapor deposition (PVD) technique such as vacuum deposition, sputtering, ion-plating or molecular beam epitaxial growth technique in the presence of oxygen gas. In this case, the above-mentioned sintered mass or block is used as a vapor source or target which is evaporated in a vacuum chamber to produce a thin film deposited on a substrate. Namely, the vapor source may be a block prepared by sintering the material powder such as (i) powders of metal elements of Ba, Cu, $\alpha$, $\beta$ and $\epsilon$ (elements $\alpha$, $\beta$ and $\epsilon$ have the same definition as above) as they are, (ii) a powder mixture of compounds of these elements or (iii) their combination. The vapor source may be a powder which is obtained by pulverizing the sintered block. The proportion or atomic ratio of the elements in the vapor source is selected in such a manner that the desired atomic ratio of the elements is realized in the deposited thin film taking into consideration the vaporization rate or sputtering rate or the like. The oxygen pressure in the vacuum chamber should be controlled so that the partial pressure of oxygen gas is adjusted to a range between $10^{-6}$ and $10^{-2}$ Torr. The substrates on which the thin film is deposited are preferably those that have similar crystal structure or lattice constant and may be a single crystal of MgO, sapphire or $SrTiO_3$. Desirably, the superconducting thin film is deposited on a (001) plane or (110) plane of a single crystal of MgO or $SrTiO_3$ to improve the critical current density (Jc) owing to the ordering of the crystal to the c-axis.

In the case of thin film also, the above-mentioned heat treatment of the deposited thin film is very effective. The heat treatment is carried out at a temperature of 500° to 900° C. for more than 1 hour in an oxygen containing atmosphere in which the partial pressure of oxygen is adjusted to $10^{-3}$ to $10^2$ Torr. After the heat treatment, the resulting thin film is cooled slowly at a cooling rate of less than 10° C./min.

The superconducting materials according to the present invention show a very high critical temperature compared to the conventional materials. A possible reason for this is the characteristic features of the composition and the uniform and fine crystal structure which is assured by the present process.

The novel superconducting materials according to the present invention have improved stability and a high critical temperature, so that superconductivity may be attained using a relatively less expensive cryogen in a small liquefication system, and hence the superconductive materials can be utilized advantageously in applications, such as superconducting wire, rod, parts such as magnets, thick film or thin film devices, such as Matisoo switching elements or Josephson devices, Anacker memory devices, a variety of sensors, or Superconducting Quantum Interference Devices (SQUID).

Now, embodiments of the process according to the present invention will be described by Examples, but the scope of the present invention is not to be limited thereto.

EXAMPLES

Powders of commercially available CuO and carbonate powders of Ba, Ca, La, Y and Tl, namely $BaCO_3$, $CaCO_3$, $La_2(CO_3)_3$, $Y_2(CO_3)_3$ $Dy_2(CO_3)_3$, $Tl_2CO_3$ are mixed in an atomic ratio that satisfies the following general formula:

$$(Ba, Ca)_x(\alpha, Dy)_{1-x}Tl_yCu_{1-y}$$

in which, $\alpha$ represents La or Y, the value of x and y are shown in Table 1, and the proportion (%) of Ca with respect to Ba and the proportion (%) of Dy with respect to $\alpha$ are also shown in Table 1.

The respective powder mixtures are pulverized in a ball mill to be reduced to an average particle size of 4 $\mu$m and then sintered at 750° C. for 15 hours. The resulting sintered mass or cake is pulverized again. The steps of sintering and pulverization are repeated two times under the same condition as above. The finally obtained powder having an average particle size less than 4 m is charged in a rubber mold and compressed hydrostatically under a pressure of 1.5 ton/cm² to obtain tablets of 4×10×30 mm. The tablets are sintered at 950° C. for 8 hours in air.

Resistance is measured on the tablets on which electrodes are secured with silver electroconductive paste to determine the critical temperature.

Measurement of an upper critical temperature Tc and a lower critical temperature Tcf is effected by a conventional four probe method. Temperature is measured by a calibrated Au(Fe)-Ag thermocouple.

The results are shown in Table I.

TABLE I

| Sample No. | $\alpha$ | x | Tl (y) | Ca % | Dy % | Tc | Tcf |
|---|---|---|---|---|---|---|---|
| 1 | Y | 0.66 | 0.11 | 10 | 30 | 125 | 112 |
| 2 | La | 0.66 | 0.11 | 10 | 30 | 124 | 111 |

We claim:

1. A process for producing a superconducting material comprising a compound oxide represented by the general formula:

$$(Ba, Ca)_x(a, Dy)_{1-x}Tl_yCu_{1-y}O_{3-z}$$

wherein
"a" represents Y or La; the atomic ratio of Ca to Ba is between 1% and 90%;
the atomic ratio of Dy to a is between 1% and 90%;
x, y, and z are within the ranges of $O<x<1$, and $O \leq z \leq 1$ respectively; and
the expression of (Ba, Ca) and (a, Dy) means that the respective elements occupy predetermined sites in a crystal in a predetermined proportion,
said process comprising preparing a material powder, compacting the material powder and then subjecting the resulting compact to a final sintering operation, characterized in that said material powder is
(A) a powder mixture composed of powders selected from a group consisting of
powders of elemental Ba, Cu, Ca, a, Dy and Tl and
(ii) powders of compounds each containing at least one of said elements Ba, Cu, Ca, a, Dy and Tl,
(B) a sintered powder obtained by sintering preliminarily the powder mixture (A) and then pulverizing the resulting sintered mass, or
(C) a powder mixture of said powder mixture (A) and said sintered powder (B),
in which "a" represents Y or La,
wherein, the atomic ratios of (Ba, Ca): (a, Dy): Tl: Cu in said material powder are $x:(1-x):y:(1-y)$, the atomic ratio of Ca to Ba is between 1% and 90%, the atomic ratio of Dy to a is between 1% and 90%, x and y are within the ranges of $O<x<1$ and $O<y<1$, respectively.

2. A process according to claim 1 wherein the atomic ratio of Ca to Ba is between 1% and 50%.

3. A process according to claim 1 wherein the sintered powder is obtained by repeating, at least three times, the steps of preliminarily sintering the powder mixture (A) and pulverizing the sintered mass.

4. A process according to claim 1 wherein said compound or compounds are oxide, carbonate, sulfate, nitrate or oxalate, each containing at least one of said elements of Ba, Cu, Ca, a, Dy and Tl.

5. A process according to claim 1 wherein said compound or compounds are in a form of powder having an average particle size of less than 10 μm.

6. A process according to claim 1 wherein said final sintering operation is carried out at a temperature which is higher than 700° C. but is not higher than the lowest melting point of any one of said compounds, for a duration of from 1 to 50 hours.

7. A process according to claim 1 wherein said preliminary sintering operation is carried out in an atmosphere containing oxygen gas at a partial pressure of $10^{-3}$ to $10^2$ Torr.

8. A process according to claim 1 wherein after the final sintering is complete, the resulting sintered mass is cooled at a cooling rate which is not slower than 1° C./min but not greater than 1,000° C./min.

9. A process according to claim 1 wherein after the final sintering is complete, the resulting sintered mass is heat-treated at a temperature between 500° and 800° C.

10. A process according to claim 9 wherein said heat-treatment is carried out in an atmosphere containing oxygen gas having a partial pressure between $10^{-3}$ and $10^2$ Torr.

11. A process according to claim 1 wherein said superconducting material is used as a vapor source and a thin film superconductor is produced by depositing a thin film of said superconducting material on a substrate by physical vapor deposition.

12. A process according to claim 11 wherein a deposited thin film is heat-treated at a temperature between 500° and 900° C.

13. A process according to claim 12 wherein the heat-treatment is carried out in an oxygen containing atmosphere.

14. A process for producing a superconducting material of the form $$(Ba, Ca)_x(a, Dy)_{1-x}Tl_yCu_{1-y}O_{3-z}$$

wherein
"a" represents Y or La;
the atomic ratio of Ca to Ba is between 1% and 90%;
the atomic ratio of Dy to a is between 1% and 90%;
x, y, and z are within the ranges of $O<x<1$, respectively, and
the expression of (Ba, Ca) and (a, Dy) means that the respective elements occupy predetermined sites in a crystal in a predetermined proportion,
said process comprising:
preparing a material powder, said material powder comprising a powder mixture composed of powders selected from a group consisting of
powders of elemental Ba, Cu, Ca, a, Dy and Tl, and
powders of compounds each containing at least one of said elements Ba, Cu, Ca, a, Dy and Tl;
compacting said powder mixture;
subjecting the resultant compact to a final sintering operation;
wherein the atomic ratios of (Ba, Ca): (a, Dy): Tl:Cu in said powder mixture are $x:(1-x):y:(1-y)$, the atomic ratio of Ca to Ba is between 1% and 90%, atomic ratio of Dy to a is between 1% and 90%, and x and y are within the ranges of $O<x<1$ and $O<y<1$, respectively.

15. A process for producing a superconducting material as recited in claim 14 further comprising the step of preliminary sintering said powder mixture, and wherein the step of preparing said material powder includes the step of pulverizing the resulting sintered mass.

16. A process for producing a superconducting material of the form $$(Ba, Ca)_x(a, Dy)_{1-x}Tl_yCu_{1-y}O_{3-z}$$

wherein
"a" represents Y or La:
the atomic ratio of Ca to Ba is between 1% and 90%;
the atomic ratio of a to Dy is between 1% and 90%;
x, y, and z are within the ranges of $O<x<1$, $O<y<1$, and $O \leq z \leq 1$, respectively, and the expression of (Ba, Ca) and (a, Dy) means that the respective elements occupy predetermined sites in a crystal in a predetermined proportion,
said process comprising:
preparing a material powder, said material powder comprising a powder mixture made up of
(A) a powder mixture composed of powders selected from a group consisting of:

powders of elemental Ba, Cu, Ca, α, Dy and Tl, and powders of compounds each containing at least one of said elements Ba, Cu, Ca, α, Dy and Tl; and (b) a sintered powder obtained by preliminarily sintering a powder mixture as recited in (A) above, and pulverizing the resulting sintered mass;

compacting said powder mixture;

subjecting the resultant compact to a final sintering operation;

wherein the atomic ratios of (Ba, Ca): (α, Dy): Tl: Cu in said material powder are $x:1-x:y:1-y$, the atomic ratio of Ca to Ba is between 1% and 90%, the atomic ratio Dy to α is between 1% and 90%, x and y are within ranges of $0<x<1$ and $0<y<1$, respectively.

* * * * *

UNITED STATES PATENT AND TRADEMARK OFFICE
CERTIFICATE OF CORRECTION

PATENT NO. : 5,100,866
DATED : March 31, 1992
INVENTOR(S) : Hideo Itozaki, et al It is certified that error appears in the above-identified patent and that said Letters Patent is hereby corrected as shown below: On the title page and Column 1, line 2, should read
--PROCESS FOR PRODUCING COMPOUND OXIDE HIGH TEMPERATURE SUPERCONDUCTING MATERIAL CONTAINING $(Ba, Ca)_x (RE, Dy)_{1-x} Tl_y Cu_{1-y} O_{3-z}$ where RE= Y or La--.

Col. 7, line 11, claim 1 after "0<x<1" insert --0<y<1--.

Col. 7, line 23, claim 1 delete "(ii)".

Col. 8, line 23, claim 14 after "0<x<1," insert --0<y<1, 0≤z≤1,--.

Signed and Sealed this

Fifth Day of October, 1993

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO. : 5,100,866
DATED : March 31, 1992
INVENTOR(S) : Itozaki, et al

It is certified that error appears in the above-indentified patent and that said Letters Patent is hereby corrected as shown below:

On the cover page after the identification of the Assignee: [73] insert -- [*] Notice: The portion of the term of this patent subsequent to November 14, 2006, has been disclaimed.--

Signed and Sealed this

Twelfth Day of July, 1994

Attest:

BRUCE LEHMAN

Attesting Officer

Commissioner of Patents and Trademarks